US009628060B2

(12) United States Patent
Ye et al.

(10) Patent No.: US 9,628,060 B2
(45) Date of Patent: Apr. 18, 2017

(54) SEMICONDUCTOR DEVICE AND OPERATING METHOD THEREOF

(71) Applicants: SK hynix Inc., Icheon (KR); SEOUL NATIONAL UNIVERSITY R&DB FOUNDATION, Seoul (KR)

(72) Inventors: Seok-Min Ye, Seoul (KR); Suhwan Kim, Seoul (KR); Deog-Kyoon Jeong, Seoul (KR)

(73) Assignees: SK HYNIX INC., Icheon (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 14/839,640

(22) Filed: Aug. 28, 2015

(65) Prior Publication Data

US 2016/0149565 A1 May 26, 2016

(30) Foreign Application Priority Data

Nov. 20, 2014 (KR) .......................... 10-2014-0162850

(51) Int. Cl.
*H03K 5/1532* (2006.01)
*H03K 5/133* (2014.01)

(52) U.S. Cl.
CPC ........... *H03K 5/1532* (2013.01); *H03K 5/133* (2013.01)

(58) Field of Classification Search
CPC ................ G01R 31/00; G01R 31/2846; H03K 2005/00; H03K 2005/00286; H03K 5/00; H03K 5/13; H03K 5/133; H03K 5/15; H03K 5/1532; H03L 7/00; H03L 7/0812
USPC .......................................................... 327/244
See application file for complete search history.

(56) References Cited

U.S. PATENT DOCUMENTS

| 7,567,104 B2 * | 7/2009 | Ku ....................... G06F 13/1689 327/141 |
| 8,578,086 B2 | 11/2013 | Chaudhuri et al. |
| 2008/0291758 A1 | 11/2008 | Chu et al. |
| 2015/0130971 A1 * | 5/2015 | Oike ..................... H03M 1/186 348/241 |

* cited by examiner

*Primary Examiner* — Lincoln Donovan
*Assistant Examiner* — David Mattison

(57) ABSTRACT

A semiconductor device may include: a variable delay circuit configured to delay a data strobe signal according to a delay control signal and output a delayed data strobe signal; a data sampler configured to compare a level of a reference voltage and a value of a data signal in synchronization with the delayed data strobe signal, and determine a logic level of the value of the data signal, the data signal having a training pattern; and a control circuit configured to determine a delay amount of the data strobe signal and generate the delay control signal and the reference voltage according to an output signal of the data sampler.

20 Claims, 9 Drawing Sheets

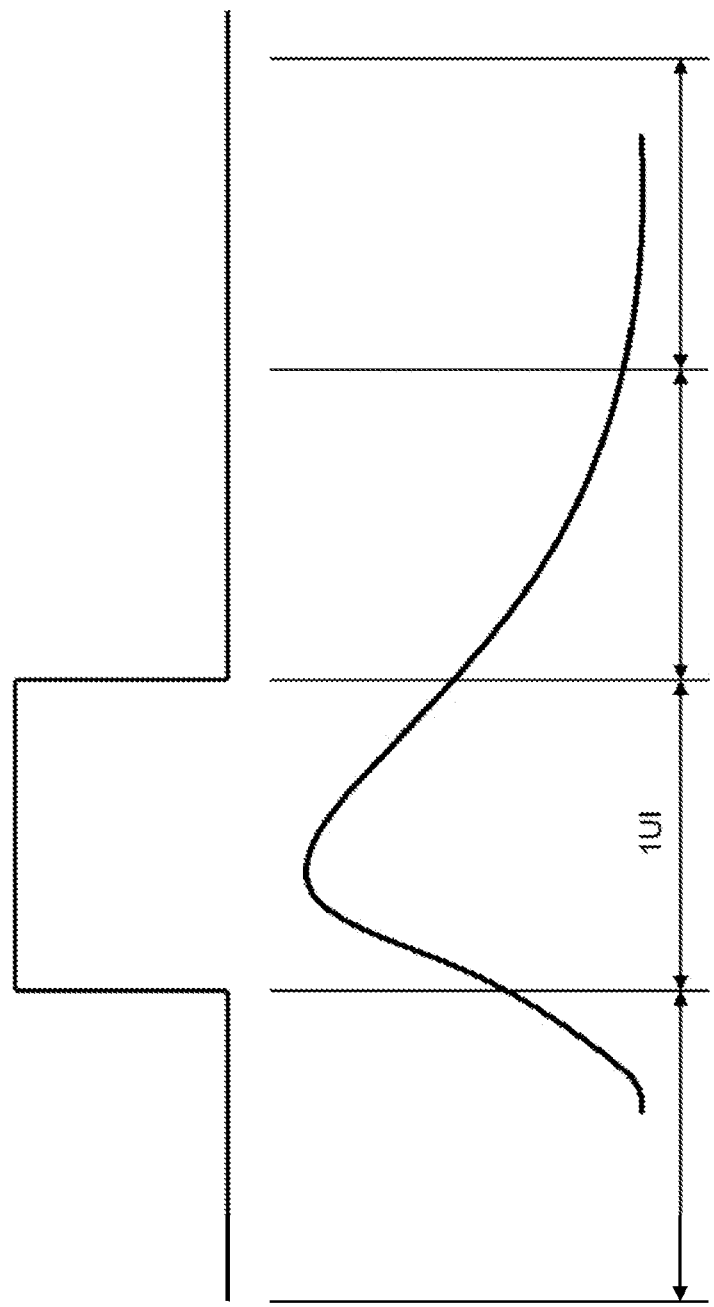

SEMICONDUCTOR DEVICE AND OPERATING METHOD THEREOF

CROSS-REFERENCE TO RELATED APPLICATION

The present application claims priority of Korean Patent Application No. 10-2014-0162850, filed on Nov. 20, 2014, which is incorporated herein by reference in its entirety.

BACKGROUND

1. Field

Embodiments of the present disclosure relate to a semiconductor device which determines a logic level of data from an analog signal transmitted through a channel, and an operating method thereof, and more particularly, to a semiconductor device which determines a reference voltage and a sampling timing of determining the logic level of data and an operating method thereof.

2. Description of the Related Art

Semiconductor chips or modules transmit and receive data to communicate with each other. For example, a memory controller and a memory device are connected to each other through channels, and transmit and receive signals such as commands, addresses, and data through the channels.

When a memory controller is powered on, an operation of initializing the memory controller is performed, and then the memory device is booted. A booting sequence of the memory device is defined by a memory specification such as Low-Power Double-Data-Rate 4 (LPDDR4).

Before the memory controller and the memory device transmit and receive data, a training operation to reliably transmit and receive the data is performed. In addition, since the memory specification such as LPDDR4 requires low power consumption and high-speed operation characteristics, a semiconductor device is desirable to perform a data read training operation suitable for such a low-power consumption and high-speed operation.

SUMMARY

Various embodiments are directed to a semiconductor device capable of performing a read training operation such that a received data signal and a data strobe signal are controlled to reliably read data, and an operating method thereof.

Also, various embodiments are directed to a semiconductor device capable of performing a read training operation such that data can be reliably read in a system environment requiring low power consumption and high-speed operation characteristics, and an operating method thereof.

Furthermore, various embodiments are directed to a semiconductor device capable of reducing Inter-Symbol Interference (ISI) associated with a read training operation and an operating method thereof.

In an embodiment, a semiconductor device may include: a variable delay circuit configured to delay a data strobe signal according to a delay control signal and output a delayed data strobe signal; a data sampler configured to compare a level of a reference voltage and a value of a data signal in synchronization with the delayed data strobe signal, and determine a logic level of the value of the data signal; and a control circuit configured to determine a delay amount of the data strobe signal, and generate the delay control signal and the reference voltage according to an output signal of the data sampler.

In an embodiment, an operating method of a semiconductor device may include: determining a delay amount of a data strobe signal to generate a delayed data strobe signal; determining a level of a reference voltage; and comparing the level of the reference voltage and a value of a data signal in synchronization with the delayed data strobe signal to generate an output signal.

BRIEF DESCRIPTION OF THE DRAWINGS

FIGS. 5A and 5B illustrate digital and analog waveforms of a data signal of FIG. 1, respectively, in accordance with an embodiment.

DETAILED DESCRIPTION

Figure 1:
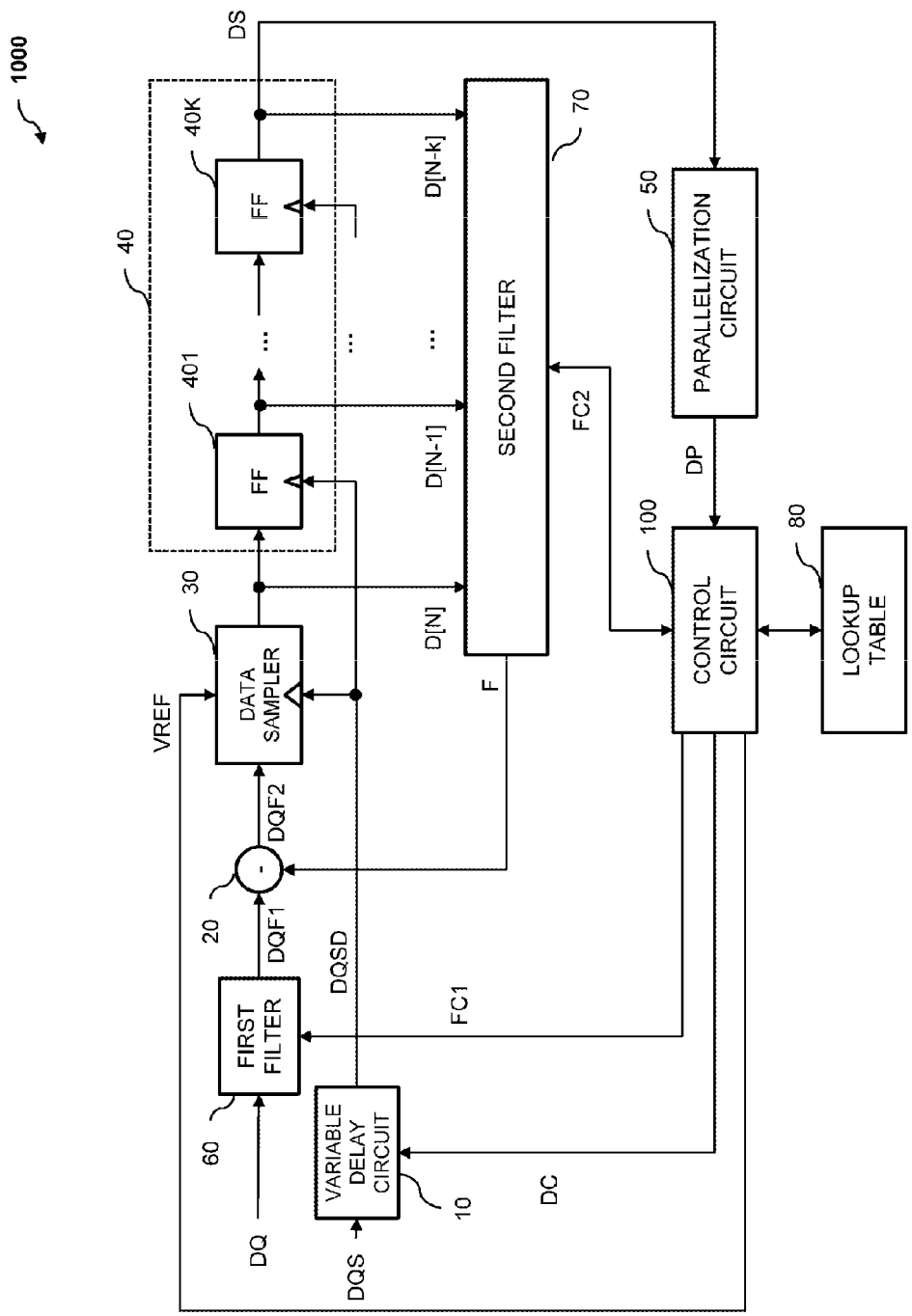
FIG. 1 is a block diagram illustrating a semiconductor device in accordance with an embodiment.

Various embodiments will be described below in more detail with reference to the accompanying drawings. The present disclosure should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

FIG. 1 is a block diagram illustrating a semiconductor device 1000 in accordance with an embodiment.

The semiconductor device 1000 may include a variable delay circuit 10, a calculation circuit 20, a data sampler 30, a sample storage 40, a parallelization circuit 50, a first filter 60, a second filter 70, a lookup table 80, and a control circuit 100.

The variable delay circuit 10 may variably delay a data strobe signal DQS according to a delay control signal DC, and output a delayed data strobe signal DQSD. The delay control signal DC may be provided as a multi-bit digital signal.

The semiconductor device 1000 may use specific patterns of a data signal DQ and the data strobe signal DQS in a training mode.

In an embodiment, the data signal DQ may include a signal in which a waveform indicative of eight-bit data (e.g., '01000000') is periodically repeated. Hereinafter, a width of each bit (i.e., a symbol) is referred to as 1UI. In an embodiment, the data strobe signal DQS is a clock signal with a constant cycle (e.g., a cycle corresponding to 2UI), such that a waveform indicative of two-bit data (e.g., '10') is repeated.

FIGS. 5A and 5B illustrate digital and analog waveforms of the data signal DQ of FIG. 1, respectively, in accordance with an embodiment.

FIG. 5A illustrates a digital waveform of first four symbols indicative of eight-bit data '01000000' of the data signal DQ used in a training operation. FIG. 5B illustrates an analog waveform of the first four symbols of the data signal DQ input to the semiconductor device 1000 through a channel.

As shown in FIG. 5B, an actual waveform of the data signal DQ, which is input to the semiconductor device 1000, may have an edge smoother than that of the digital waveform of FIG. 5A due to attenuation of high frequency components of the data signal DQ in the channel acting as a low-pass filter.

Referring back to FIG. 1, the calculation circuit 20 may calculate a difference between a first filtered data signal DQF1 output from the first filter 60 and a filter output signal F output from the second filter 70, and output a second filtered data signal DQF2.

The data sampler 30 may compare a value of the second filtered data signal DQF2 to a level of a reference voltage VREF at a time corresponding to an edge (e.g., a rising edge) of the delayed data strobe signal DQSD, and output the comparison result as sample data D[N].

The sample storage 40 may include one or more flip-flops (FFs) 401 to 40K coupled in series where K is a natural number. The one or more FFs 401 to 40K may latch an input signal at a time corresponding to a rising edge of the delayed data strobe signal DQSD. The respective FFs 401 to 40K may store values D[N−1] to D[N−K] of the sample data D[N], respectively. These values D[N−1] to D[N−K] correspond to values of the sample data D[N] that were determined at times corresponding to previous edges of the delayed data strobe signal DQSD.

The parallelization circuit 50 may convert a serial data signal DS, output from the sample storage 40, into a multi-bit parallel data signal DP, and provide the converted parallel data signal DP to the control circuit 100.

When the data signal DQ is a signal in which the waveform indicative of '01000000' is periodically repeated, the parallelization circuit 50 may generate the parallel data signal DP by de-serializing the serial data signal DS output from the flip-flop 40K of the sample storage 40 on a basis of eight bit.

The first filter 60 may reduce or substantially remove pre-cursor Inter-Symbol Interference (ISI) existing in the data signal DQ according to a first filter control signal FC1. The second filter 70 may perform a filtering operation according to a second filter control signal FC2, and thus reduce or substantially remove post-cursor ISI existing in the data signal DQ. A person of ordinary skill in the art in light of the teachings and disclosures herein would be aware of a variety of circuits and processes for implementing the first and second filters 60 and 70.

In an embodiment, the first filter 60 may be implemented with an analog linear filter. In this embodiment, a gain of the first filter 60 is controlled according to the first filter control signal FC1 to reduce the pre-cursor ISI.

In addition, the second filter 70 may be implemented with one or more digital filters, and generate the filter output signal F by linearly combining values of the sample data D[N] and the previous sample data D[N−1] to D[N−K]. A value of the filter output signal F of the second filter 70 may be represented as follows:

$$F = \alpha_0 D[N] + \alpha_1 D[N-1] + \ldots + \alpha_K D[N-K]$$ Equation 1 where $\alpha_i$ is a filter coefficient corresponding to i (0≤i≤K).

In an embodiment, the control circuit 100 may determine the coefficients $\alpha_i$ of the second filter 70 using a least mean square (LMS) algorithm. A person of ordinary skill in the art in light of the teachings and disclosures herein would be aware of a variety of circuits and processes for implementing the control circuit 100.

The lookup table 80 may store values associated with information on quantitatively adjusting values of a main cursor and a post-cursor based on the first filter control signal FC1 to remove the pre-cursor ISI. In an embodiment, the values stored in the lookup table 80 may be previously determined through a simulation.

The control circuit 100 may control a read training operation. The control circuit 100 may first determine a sampling time by adjusting the delay control signal DC, and then determine the reference voltage VREF.

While the sampling time is determined, the first and second filters 60 and 70 may not perform corresponding filtering operations.

While determining the reference voltage VREF, the control circuit 100 may control the first and second filters 60 and 70 to reduce the pre-cursor ISI and the post-cursor ISI at the same time.

Figure 2:
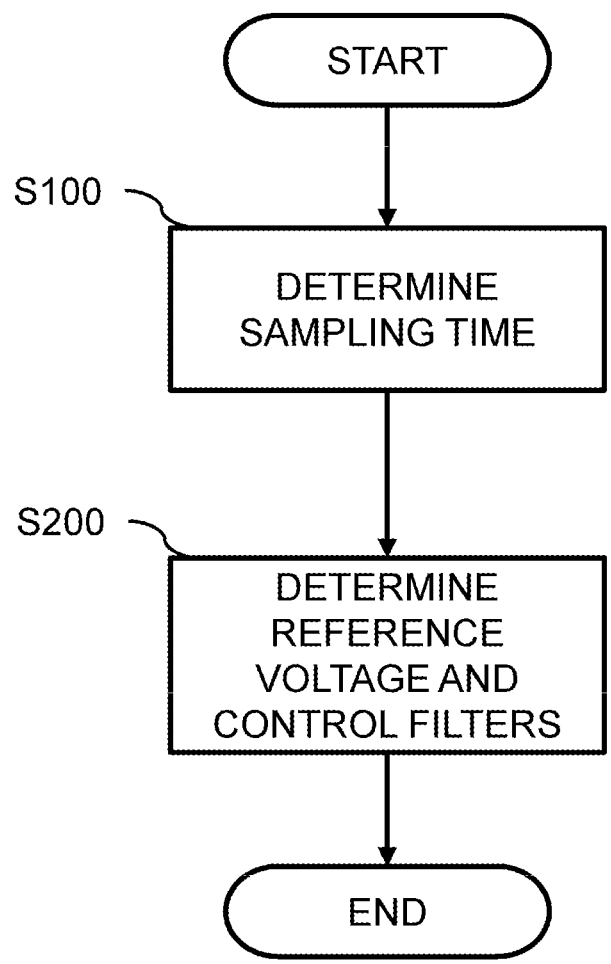
FIG. 2 is a flowchart illustrating an operation of the semiconductor device of FIG. 1 in accordance with an embodiment.

FIG. 2 is a flowchart illustrating an operation of the semiconductor device 1000 of FIG. 1.

At S100, the control circuit 100 of FIG. 1 may determine a sampling time by adjusting a value of the delay control signal DC. While the sampling time is determined, the first and second filters 60 and 70 may not operate. Thus, at this time, the first and second filtered data signals DQF1 and DQF2 are substantially the same as the data signal DQ.

The process of determining the sampling time will be described in detail with reference to FIG. 3.

Referring back to FIG. 2, at S200, after the sampling time is determined, the control circuit 100 may determine the reference voltage VREF, and control the first and second filters 60 and 70. This operation will be described in detail with reference to FIGS. 4A and 4B.

Figure 3:
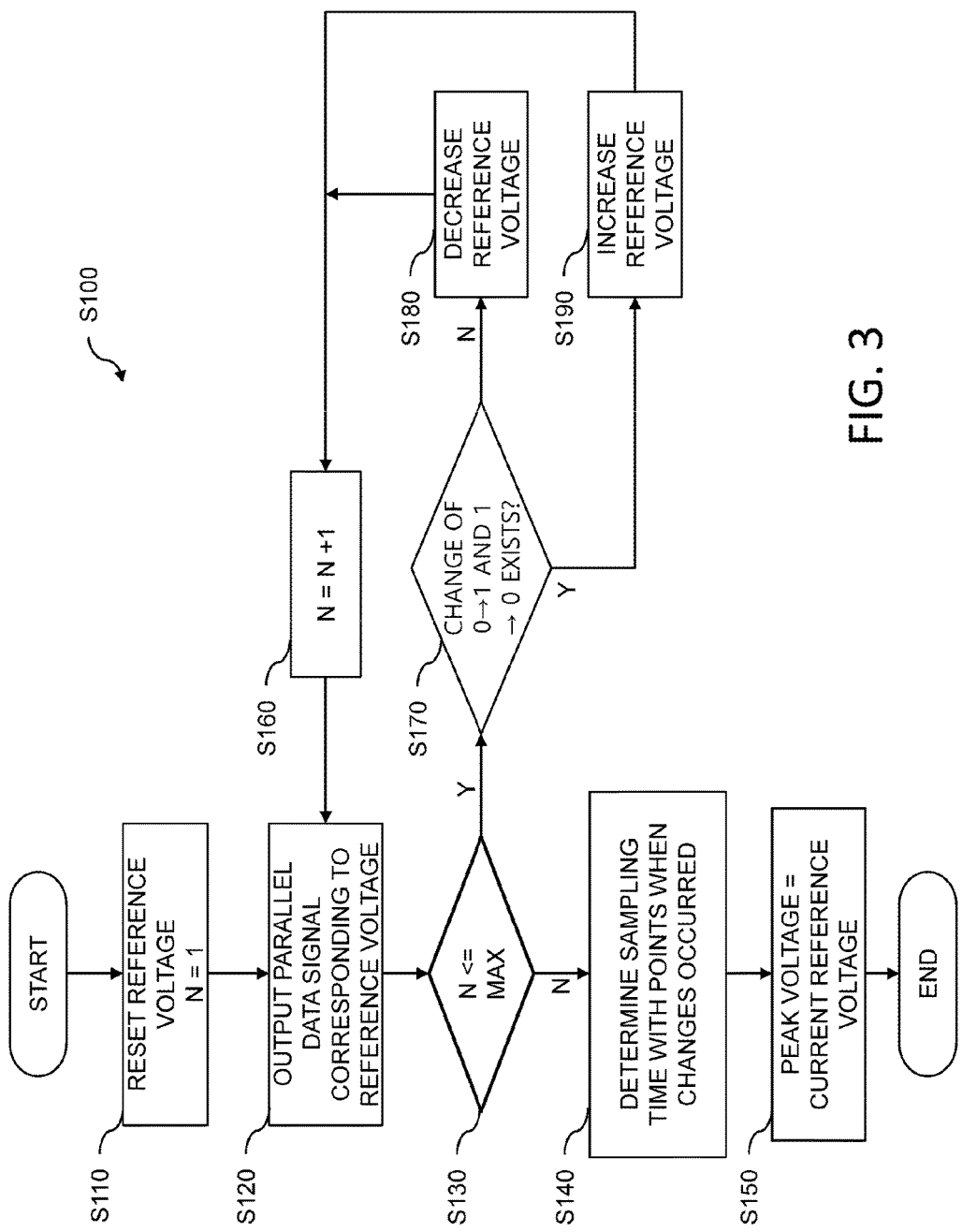
FIG. 3 is a flowchart illustrating an operation of determining a sampling timing of FIG. 2 in accordance with an embodiment.

FIG. 3 is a flowchart illustrating the operation S100 of determining the sampling time shown in FIG. 2 in accordance with an embodiment.

Hereafter, the operation S100 of determining the sampling time will be described with reference to FIGS. 6 and 7.

In an embodiment, the control circuit 100 may determine the sampling time to substantially correspond to a point in time where the data signal DQ has a maximum value (hereinafter, referred to as 'a peak voltage').

First, the reference voltage VREF may be reset at step S110. Referring to FIGS. 6 and 7, the reference voltage VREF is represented as a four-bit digital code. The reference voltage VREF may have an analog voltage level corresponding to the digital code. Although the reference voltage VREF is represented as the four-bit digital code, embodiments of the present disclosure are not limited thereto. In other embodiments, the digital code may have a different bit number.

Figure 6:
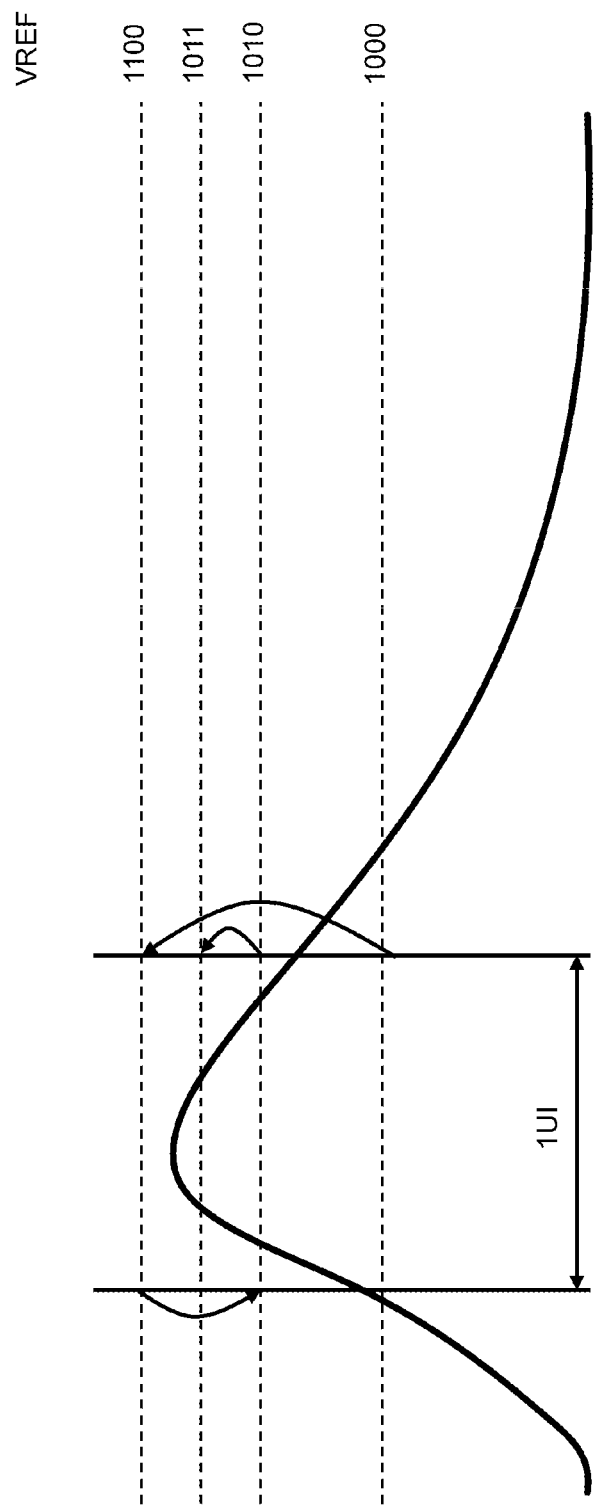
FIGS. 6 and 7 illustrate the operation of determining the sampling timing of FIG. 2 in accordance with an embodiment.

In the embodiment shown in FIG. 6, an intermediate value corresponding to the digital code '1000' may be selected as an initial value of the reference voltage VREF. Furthermore, an index N (hereinafter referred to as 'loop control number') indicating how many loops are repeated may be reset to 1 at S110.

Then, at S120, the semiconductor device 1000 generates a parallel data signal DP based on the reference voltage VREF reset at S110. The parallel data signal DP may have a value changing depending on a value of the reference voltage VREF. For example, when the reference voltage VREF (e.g., a level corresponding to the digital code '1100' in FIG. 6) is set to be higher than a peak voltage of the data signal DQ, the parallel data signal DP has an eight-bit value of '00000000'. When the reference voltage VREF (e.g., a level corresponding to the digital code '1000') is set to be lower than the peak voltage of the data signal DQ, the parallel data signal DP has an eight-bit value (e.g., '01110000') including at least one logic high value '1'.

Then, at S130, the control circuit 100 may compare the loop control number N to a predetermined maximum value MAX. When the loop control number N is equal to or less than the maximum value MAX, the operation S100 proceeds to S170.

The maximum value MAX of the loop control number N may be predetermined depending on the bit number of the digital code indicating the reference voltage VREF. In the embodiment of FIG. 6, the maximum value MAX may be set to four.

At S170, the control circuit 100 may scan the parallel data signal DP from the most significant bit (MSB) to the least significant bit (LSB) and determine whether the parallel data signal DP has both a first portion '01' in which values of a first pair of consecutive bits have different values '0' and '1' in the scanning direction and a second portion '10' in which values of a second pair of consecutive bits have different values '1' to '0' in the scanning direction. When the control circuit 100 determines that the parallel data signal DP has both the first and second portions, the control circuit 100 may store a first point in time at which the values of the first pair of consecutive bits changes from '0' to '1' in the scanning direction and a second point in time at which the values of the second pair of consecutive bits changes from '1' to '0' in the scanning direction. The control circuit 100 may update previously stored first and second points in time based on the determination result.

As illustrated in FIG. 6, when the parallel data signal DP includes both the first portion '01' and the second portion '10,' the reference voltage VREF may be lower than the peak voltage of the data signal DQ. When the parallel data signal DP does not include both the first portion '01' and the second portion '10,' the reference voltage VREF may be higher than the peak voltage of the data signal DQ.

Thus, when the parallel data signal DP includes both the first portion '01' and the second portion '10,' the control circuit 100 may increase a level of the reference voltage VREF at S190. On the other hand, when the parallel data signal DP does not include both the first portion '01' and the second portion '10,' the control circuit 100 may decrease the level of the reference voltage VREF at S180.

Referring to FIG. 6, a value of the digital code indicative of the reference voltage VREF may be added or subtracted by a value that has the logic high value '1' in the order of decreasing from the MSB to the LSB of the digital code. In the embodiment shown in FIG. 6, the analog voltage level corresponding to the digital code of the reference voltage VREF becomes closer to the level of the peak voltage of the data signal DQ after performing four loop control operations. For example, when a first analog voltage level corresponding to the initial value '1000' of the digital code of the reference voltage VREF is less than the level of the peak voltage of the data signal DQ, the control circuit 100 adds a value of '0100' to the initial value '1000' in a first loop to increase the initial value '1000' to a second value '1100.' When a second analog voltage level corresponding to the second value '1100' of the digital code of the reference voltage VREF is greater than the level of the peak voltage of the data signal DQ, the control circuit 100 subtracts a value '0010' from the second value '1100' in a second loop to decrease the second value '1100' to a third value '1010.' When a third analog voltage level corresponding to the third value '1010' of the digital code of the reference voltage VREF is less than the level of the peak voltage of the data signal DQ, the control circuit 100 adds a value of '0001' to the third value '1010' in a third loop to increase the third value '1010' to a fourth value '1011.'

For each loop control operation, the control circuit 100 may increase the loop control number N by one at S160, and perform the above-described loop operation again at S120.

Figure 7:
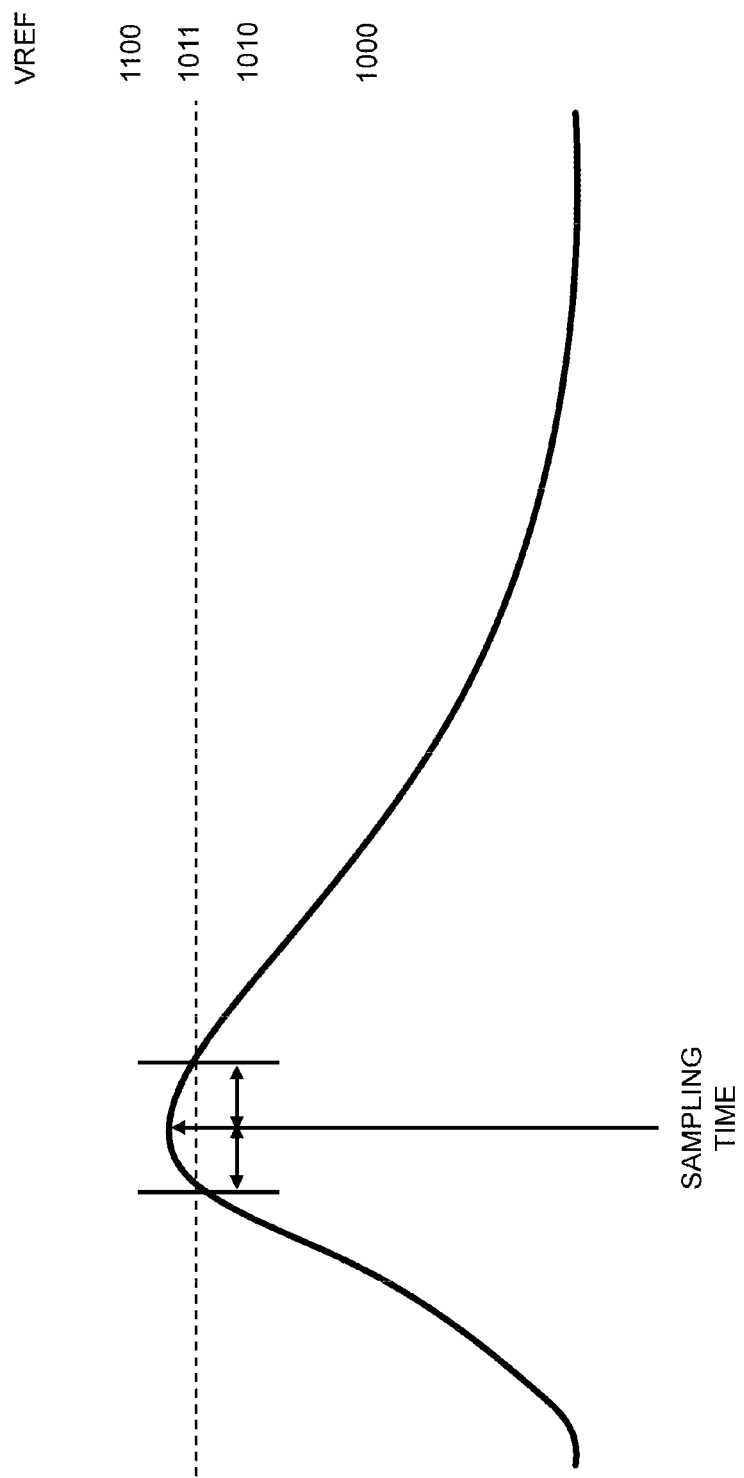

Referring to FIG. 7, when the loop control number N exceeds the maximum number MAX at S130, at S140, the control circuit 100 may determine the sampling time as an intermediate point between two points in time at which the values of the corresponding consecutive two bits have different bit values, e.g., '01' and '10,' respectively. In an embodiment, the sampling time corresponds to an average value of the two points in time. At S140, the control circuit 100 may adjust the delay control signal DC to have a value corresponding to the determined sampling time. As a result, the variable delay circuit 10 of FIG. 1 may delay the data strobe signal DQS by a time corresponding to the delay control signal DC to output the delayed data strobe signal DQSD. In an embodiment, the variable delay circuit 10 causes an edge of the delayed data strobe signal DQSD to correspond to the sampling time, which substantially corresponds to the peak voltage of the data signal DQ.

Then, at S150, the control circuit 100 may store the finally set reference voltage VREF as the peak voltage of the data signal DQ. At this time, the peak voltage may substantially correspond to a main cursor of the data signal DQ. In an embodiment, a difference between the peak voltage of the data signal DQ and the finally set reference voltage VREF is less than 10% of the level of the peak voltage. In another embodiment, the difference between the peak voltage of the data signal DQ and the finally set reference voltage VREF is less than 5% of the level of the peak voltage. In still another embodiment, the difference between the peak voltage of the data signal DQ and the finally set reference voltage VREF is less than 1% of the level of the peak voltage.

Figure 4A:
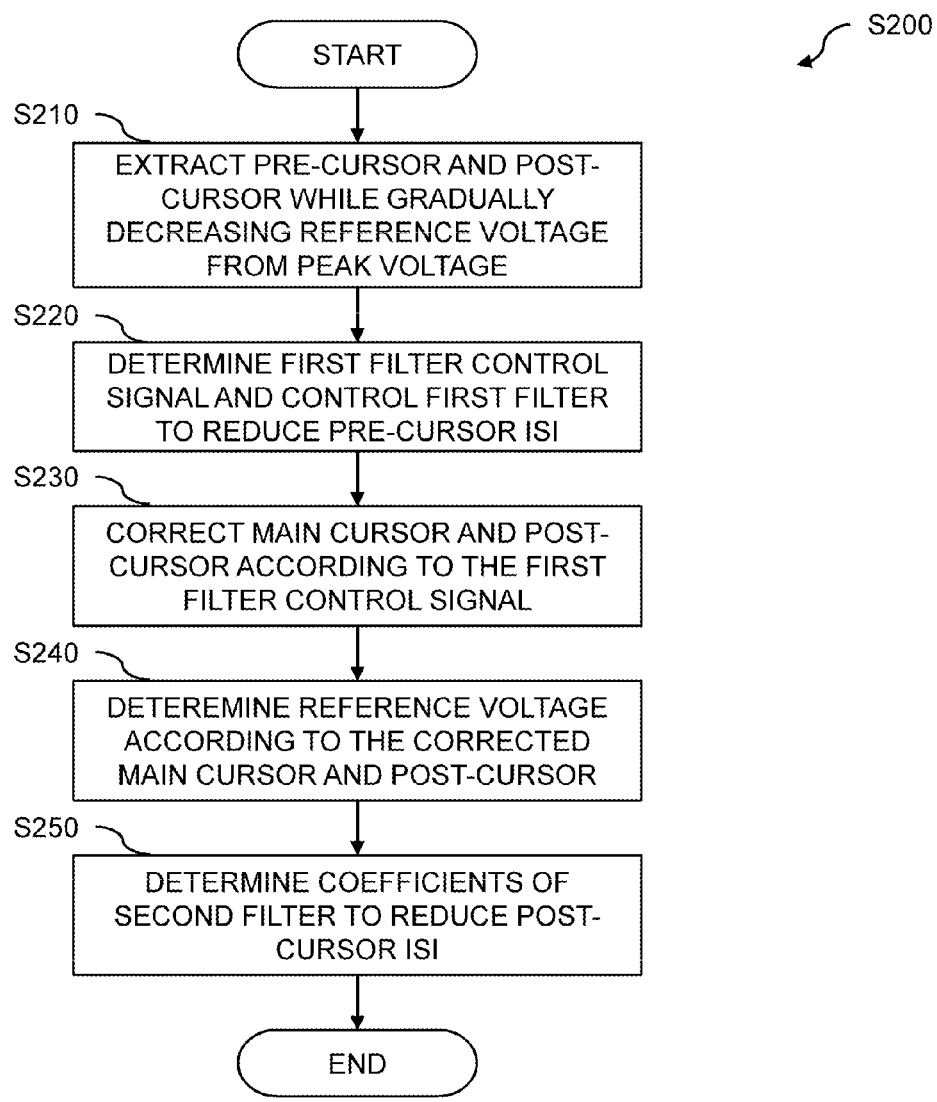
FIGS. 4A and 4B are flowcharts illustrating an operation of determining a reference voltage and a filter control signal of FIG. 2 in accordance with an embodiment.

FIG. 4A is a flowchart illustrating the operation S200 of determining the reference voltage VREF and controlling filters in accordance with an embodiment.

At S210, the control circuit 100 may extract values of a pre-cursor and a post-cursor of the data signal DQ while gradually decreasing the level of the reference voltage VREF from that of the peak voltage (a main cursor of the data signal DQ). During the process of S210, the first and second filters 60 and 70 may not operate.

Figure 8:
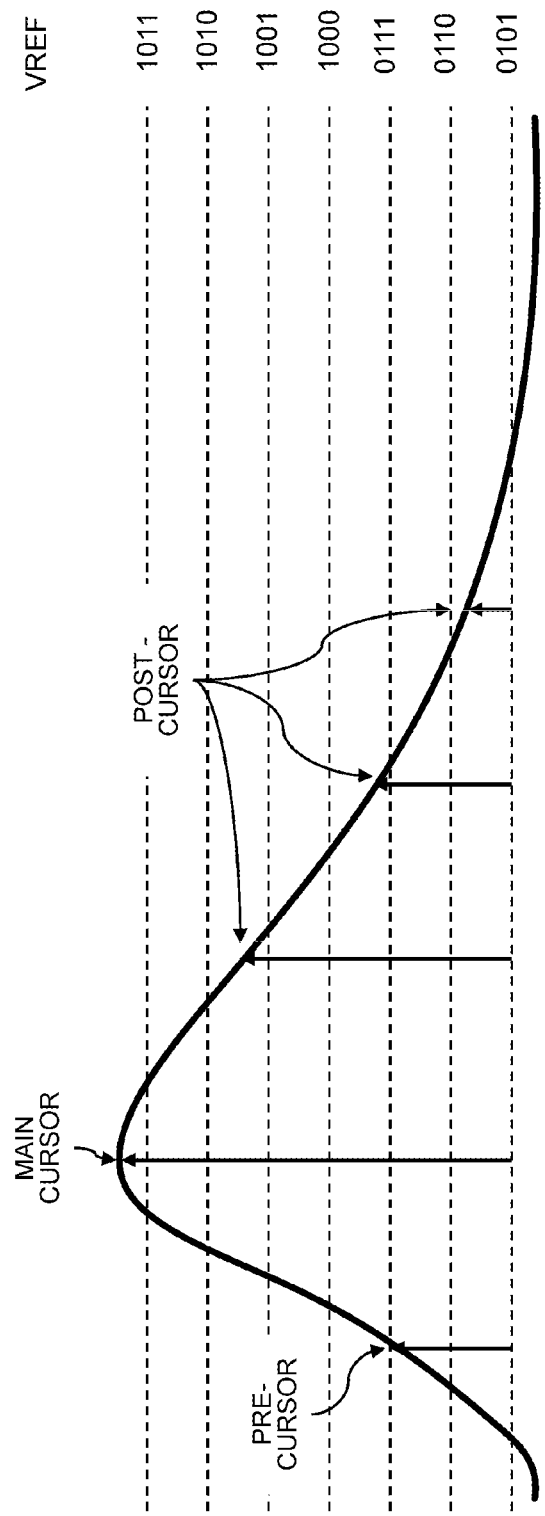
FIG. 8 illustrates a pre-cursor, a main cursor, and a plurality of post-cursors.

FIG. 8 illustrates a main cursor, a pre-cursor, and a plurality of post-cursors after the sampling time is determined. Although the embodiment shown in FIG. 8 shows one pre-cursor and three post-cursors, embodiments of the present disclosure are not limited thereto.

When the digital code of the reference voltage VREF has the value '1011' substantially corresponding to the level of the peak voltage of the data signal DQ, the parallel data signal DP has an eight-bit value of '01000000.' As the level of the reference voltage VREF is gradually decreased from that of the peak voltage by an amount corresponding to the value of '0001,' the value of the parallel data signal DP may be changed to have a value different from the value of '01000000,' as will be described below in detail.

When the MSB of the parallel data signal DP is changed, the value of the reference voltage VREF corresponds to the value of the pre-cursor. That is, the value of the pre-cursor may be extracted when the value of the parallel data signal DP is changed from '01XXXXXX' to '11XXXXXX.'

The value of the first post-cursor may be extracted when the value of the parallel data signal DP is changed from 'X10XXXXX' to 'X11XXXXX.'

The value of the second post-cursor may be extracted when the value of the parallel data signal DP is changed from 'X110XXXX' to 'X111XXXX.'

The value of the third post-cursor may be extracted when the value of the parallel data signal DP is changed from 'X1110XXX' to 'X1111XXX.'

Through the above-described operation, the values of the pre-cursor, the main cursor, and the post-cursors may be extracted.

When the value of the pre-cursor is determined, the control circuit 100 may determine a value of the first filter control signal FC1 to reduce or substantially remove the pre-cursor ISI at S220. In an embodiment, the lookup table 80 may previously store values of the first filter control signal FC1, each of which is used to reduce corresponding pre-cursor ISI. As described above, the stored values of the first filter control signal FC1 may be previously determined through a simulation.

Then, the control circuit 100 may correct values of the main cursor and the post-cursors, such that changes in the values of the main cursor and the post-cursors according to the first filter control signal FC1 can be compensated for at S230. When the first filter 60 operates according to the first filter control signal FC1, the first filter 60 may output the first filter data signal DQF1 having a waveform different from that of the data signal DQ. As a result, a waveform of the second filter data signal DQF2 may be also changed. That is, the second filter data signal DQF2 has a waveform different from its previous waveform that it has prior to the operation of the first filter 60. This leads to changes in the values of the main cursor and the post-cursors.

In an embodiment, the changes in the values of the main cursor and the post-cursors according to the first filter control signal FC1 may be stored in the lookup table 80 through a simulation. Thus, as soon as the first filter control signal FC1 is determined, the control circuit 100 can compensate for the changes in the values of the main cursor and the post-cursors to correct the values. That is, the corrected values of the main cursor and the post-cursors correspond to a state in which the pre-cursor ISI is substantially removed.

Then, at S240, the control circuit 100 may determine the reference voltage VREF by performing an operation on the corrected values of the main cursor and post-cursors. In an embodiment, the control circuit 100 may calculate a sum of the values of the main cursor and the post-cursors, divide the calculated sum by a half, and determine the divided value as the reference voltage VREF. Up to S240, the second filter 70 may not operate.

Then, at S250, the control circuit 100 may activate the second filter 70 to start a filtering operation, and apply a post-cursor ISI reducing algorithm to determine values of the coefficients of the second filter 70. A person of ordinary skill in the art in light of the teachings and disclosures herein would be aware of algorithms (e.g., least mean square algorithm) for implementing the post-cursor ISI reducing algorithm.

Figure 4B:
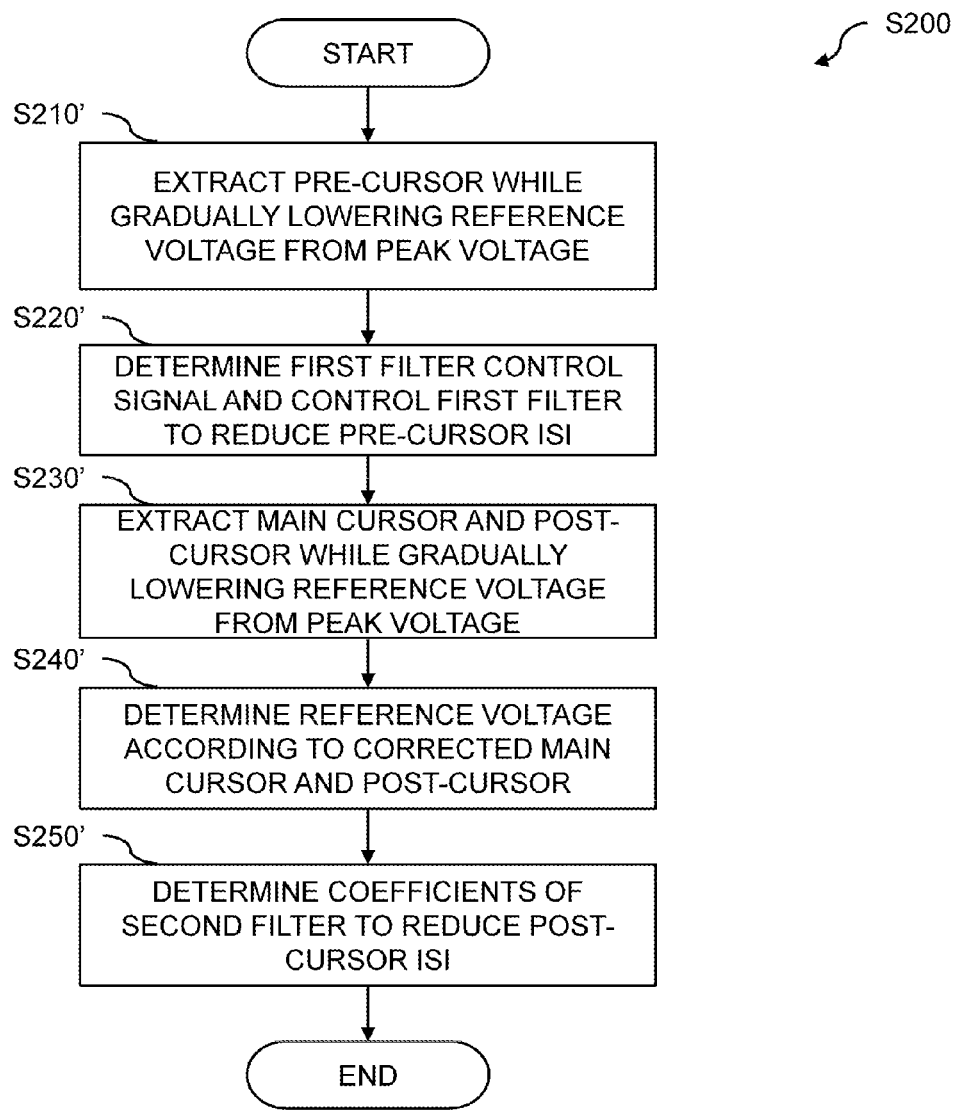

FIG. 4B is a flowchart illustrating an operation S200' of determining the reference voltage VREF and controlling the filters in accordance with another embodiment.

The embodiment of FIG. 4B is different from the embodiment of FIG. 4A in that a value of a pre-cursor is extracted at S210' and the pre-cursor ISI is substantially removed at S220', and then values of a main cursor and post cursors are extracted at S230' to determine the reference voltage VREF at S240'. That is, the value of the pre-cursor is extracted at a process different from that of extracting the values of the main cursor and post cursors.

The operation at S210' of extracting the value of the pre-cursor and the operation at S230' of extracting the values of the main cursor and the post-cursors may be performed by reducing a level of the reference voltage VREF from that of a peak voltage, similarly to that at S210 of FIG. 4A as described above.

In the embodiment of FIG. 4B, at S220', the first filter 60 may output the first filter data signal DQF1 having a waveform that is different from that of the data signal DQ, which leads to changes in the values of the main cursor and the post-cursors. Since the changed values of the main cursor and the post-cursors are extracted at S230', the lookup table 80 may not be used to compensate for the changes in the main cursor and the post-cursors as described above with reference to S230 of FIG. 4A.

Operations at S240' and S250' may be performed in substantially the same manner as those at S240 and S250 of FIG. 4A.

In accordance with embodiments of the present disclosure, a semiconductor device may sample data at an optimal time, and reduce or substantially remove ISI, thereby reducing an error in data handling operations.

Furthermore, such a semiconductor device may not only be used in a data receiving stage of a memory controller or a memory device based on the next-generation specification such as LPDDR4, but also used in other types of a data receiver.

The above embodiments of the present disclosure are illustrative and not limitative. Various alternatives and equivalents are possible. Other additions, subtractions, or modifications are obvious in view of the present disclosure and are intended to fall within the scope of the appended claims.

What is claimed is:

1. A semiconductor device comprising:
   a variable delay circuit configured to delay a data strobe signal according to a delay control signal and output a delayed data strobe signal;
   a data sampler configured to compare a level of a reference voltage and a value of a data signal in synchronization with the delayed data strobe signal, and determine a logic level of the value of the data signal; and
   a control circuit configured to determine a delay amount of the data strobe signal, and generate the delay control signal based on an output signal of the data sampler,
   wherein the control circuit adjusts the level of the reference voltage while determining the delay amount of the data strobe signal.

2. The semiconductor device of claim 1, further comprising:
   a first filter configured to filter the data signal and output a first filtered data signal to the data sampler;
   a sample storage comprising one or more flip-flops configured to sequentially latch values of the output signal of the data sampler;
   a second filter configured to filter the output signal of the data sampler and an output signal of the sample storage; and a calculation circuit configured to calculate a difference between the first filtered data signal of the first filter and an output signal of the second filter, and output a second filtered data signal corresponding to the difference to the data sampler.

3. The semiconductor device of claim 2, wherein the control circuit controls the first filter according to a pre-cursor in the output signal of the data sampler, and controls the second filter according to a post-cursor in the output signal of the data sampler.

4. The semiconductor device of claim 3, further comprising a parallelization circuit configured to parallelize a serial data signal output from the sample storage and output a parallelized data signal to the control circuit.

5. The semiconductor device of claim 2, wherein the control circuit determines a time at which a peak voltage of the data signal occurs, the peak voltage corresponding to a maximum value of the data signal having a predetermined pattern, and determines the delay amount of the data strobe signal such that an edge of the delayed data strobe signal corresponds to the time of the peak voltage.

6. The semiconductor device of claim 5, wherein the control circuit extracts values of a pre-cursor, a main cursor, and a post-cursor of the data signal according to the determined delay amount, and determines the level of the reference voltage based on the extracted values of the pre-cursor, the main cursor, and the post-cursor.

7. The semiconductor device of claim 6, wherein the control circuit controls the first filter to reduce pre-cursor Inter-Symbol Interference (ISI) using a first filter control signal, updates the values of the main cursor and the post-cursor, and determines the reference voltage according to the updated values of the main cursor and the post-cursor.

8. The semiconductor device of claim 7, wherein the control circuit calculates a sum of the updated values of the main cursor and the post-cursor and multiplies the sum by one-half to determine the reference voltage.

9. The semiconductor device of claim 7, wherein the control circuit adjusts coefficients of the second filter to reduce post-cursor ISI after the reference voltage is determined.

10. The semiconductor device of claim 7, further comprising a lookup table configured to store values associated with changes in the values of the main cursor and the post-cursor, the values of the main cursor and the post-cursor changing according to the first filter control signal.

11. An operating method of a semiconductor device, comprising:
  determining a delay amount of a data strobe signal to generate a delayed data strobe signal based on an output signal by adjusting a level of a reference voltage,
  wherein the output signal is generated by comparing a value of a data signal and the level of the reference voltage and sampling a result of the comparison in synchronization with the delayed data strobe signal.

12. The operating method of claim 11, wherein determining the delay amount of the data strobe signal comprises:
  determining a time at which a peak voltage of the data signal occurs, the peak voltage corresponding to a maximum value of the data signal having a predetermined pattern; and
  determining the delay amount such that an edge of the delayed data strobe signal corresponds to the time of the peak voltage.

13. The operating method of claim 12, wherein determining the time of the peak voltage comprises:
  resetting the level of the reference voltage;
  determining whether the output signal includes a first portion in which values of a first pair of consecutive bits have a first logic value and a second logic value, respectively, and a second portion in which values of a second pair of consecutive bits have the second logic value and the first logic value, respectively;
  increasing the level of the reference voltage when the output signal includes both of the first and second portions; and
  decreasing the level of the reference voltage when the output signal does not include both of the first and second portions.

14. The operating method of claim 13, further comprising repeating determining whether the output signal includes both of the first and second portions, according to the increased or decreased level of the reference voltage.

15. The operating method of claim 11, wherein determining the delay amount of the data strobe signal comprises:
  (1) resetting the level of the reference voltage;
  (2) determining whether the output signal includes a first portion in which values of a first pair of consecutive bits have a first logic value and a second logic value, respectively, and a second portion in which values of a second pair of consecutive bits have the second logic value to the first logic value, respectively;
  (3) adjusting the level of the reference voltage according to the determining result by a variable amount;
  (4) increasing a loop control number by one; and
  (5) repeating steps (2) to (4) until the loop control number exceeds a predetermined number, and
  wherein the level of the reference voltage is adjusted such that the variable amount decreases as the loop control number increases.

16. The operating method of claim 11, further comprising:
  extracting values of a pre-cursor, a main cursor, and a post-cursor of the data signal;
  reducing pre-cursor Inter-Symbol Interference (ISI);
  updating the values of the main cursor and the post cursor, after reducing the pre-cursor ISI;
  deciding the level of the reference voltage according to the updated values of the main cursor and the post-cursor; and
  reducing post-cursor ISI associated with the updated value of the post-cursor.

17. The operating method of claim 16, wherein extracting the values of the pre-cursor, the main cursor, and the post-cursor comprises:
  adjusting the level of the reference voltage by a constant amount until a pattern of the output signal is changed; and
  determining the adjusted level of the reference voltage as a corresponding one of the values of the pre-cursor, the main cursor, and the post-cursor.

18. The operating method of claim 16, wherein deciding the level of the reference voltage comprises calculating a sum of the updated values of the main cursor and the post cursor and multiplying the sum by one-half.

19. The operating method of claim 11, further comprising:
  extracting a value of a pre-cursor of the data signal;
  reducing pre-cursor Inter-Symbol Interference (ISI);
  extracting values of a main cursor and a post-cursor of the data signal by changing the level of the reference voltage;
  determining the reference voltage according to the extracted values of the main cursor and the post-cursor; and
  reducing post-cursor ISI.

20. The operating method of claim 11, wherein the level of the reference voltage is adjusted by a discrete amount.

* * * * *